US011255108B2

(12) United States Patent
Leung et al.

(10) Patent No.: US 11,255,108 B2
(45) Date of Patent: Feb. 22, 2022

(54) ADAPTIVE ELECTRIC DUAL-CONTROLLED INTELLIGENT LOCK

(71) Applicant: Man Shun Server Leung, Hong Kong (CN)

(72) Inventors: Man Shun Server Leung, Hong Kong (CN); Lok Shun Leung, Hong Kong (CN)

(73) Assignee: Man Shun Server Leung, Hong Kong (CN)

( * ) Notice: Subject to any disclaimer, the term of this patent is extended or adjusted under 35 U.S.C. 154(b) by 616 days.

(21) Appl. No.: 16/321,460

(22) PCT Filed: Aug. 22, 2018

(86) PCT No.: PCT/CN2018/101676
§ 371 (c)(1),
(2) Date: Jan. 28, 2019

(87) PCT Pub. No.: WO2019/037735
PCT Pub. Date: Feb. 28, 2019

(65) Prior Publication Data
US 2021/0348424 A1    Nov. 11, 2021

(30) Foreign Application Priority Data

Aug. 22, 2017 (CN) .......................... 201710722566.9

(51) Int. Cl.
*E05B 63/00* (2006.01)
*E05B 47/00* (2006.01)
(Continued)

(52) U.S. Cl.
CPC ........ *E05B 63/0069* (2013.01); *A47G 29/124* (2013.01); *A47G 29/1225* (2013.01);
(Continued)

(58) Field of Classification Search
CPC ............ E05B 63/0069; E05B 47/0012; E05B 2047/0084; E05B 2047/0086;
(Continued)

(56) References Cited

U.S. PATENT DOCUMENTS

| 6,286,347 | B1 * | 9/2001 | Frolov | ............... E05B 47/0692 |
| | | | | 192/71 |
| 6,851,291 | B2 * | 2/2005 | Nunez | ................ E05B 47/0673 |
| | | | | 70/283 |

(Continued)

FOREIGN PATENT DOCUMENTS

| CN | 200999512 Y | 1/2008 |
| CN | 201106313 Y | 8/2008 |

(Continued)

*Primary Examiner* — Lloyd A Gall

(57) ABSTRACT

An adaptive electric dual-controlled intelligent lock includes a mechanical clutching structure and an intelligent electronic control structure. The mechanical clutching structure includes a lock head, a lock cylinder and a lock tongue, wherein: the lock cylinder includes movable buckles, springs and a bearing. After being inserted into the keyhole of the lock head and then into the locked groove, a key is turned, the movable buckles move in an elastic range of the springs and drive the lock tongue connected with the bearing to swing, thereby realizing a mechanical unlocking process. The intelligent electronic control structure includes a PCB (printed circuit board), a motor and a shifting lever, wherein: a wireless control module is connected with an external mobile intelligent device; after the motor is started, the shifting lever pushes the movable buckles, so that the bearing drives the lock tongue to swing, thereby achieving an intelligent unlocking process.

10 Claims, 4 Drawing Sheets

(51) Int. Cl.
*A47G 29/122* (2006.01)
*A47G 29/124* (2006.01)
*H02K 7/00* (2006.01)
*H05K 1/18* (2006.01)
*G07C 9/00* (2020.01)

(52) U.S. Cl.
CPC ...... *E05B 47/0012* (2013.01); *G07C 9/00714* (2013.01); *H02K 7/003* (2013.01); *H05K 1/18* (2013.01); *A47G 2029/1226* (2013.01); *A47G 2029/1257* (2017.08); *E05B 2047/0084* (2013.01); *G07C 2009/00992* (2013.01); *H05K 2201/1009* (2013.01)

(58) Field of Classification Search
CPC .............. A47G 29/1225; A47G 29/124; A47G 2029/1226; A47G 2029/1257; G07C 9/00174; G07C 2009/00992; H02K 7/003; H05K 1/18; H05K 2201/1009
USPC .............. 70/277, 278.2, 278.3, 278.7, 279.1, 70/280–283, 283.1
See application file for complete search history.

(56) References Cited

U.S. PATENT DOCUMENTS

| | | | |
|---|---|---|---|
| 8,474,290 B2* | 7/2013 | Terhaar | E05B 47/0673 70/92 |
| 2001/0018837 A1* | 9/2001 | Imedio Ocana | E05B 47/0673 70/422 |
| 2004/0003633 A1* | 1/2004 | Alexander | G07C 9/00563 70/277 |
| 2005/0092046 A1* | 5/2005 | Errani | E05B 63/0069 70/283 |
| 2011/0083482 A1* | 4/2011 | Goldman | E05B 47/0673 70/280 |

FOREIGN PATENT DOCUMENTS

| | | |
|---|---|---|
| CN | 205531701 U | 8/2016 |
| CN | 206346588 U | 7/2017 |

* cited by examiner

ADAPTIVE ELECTRIC DUAL-CONTROLLED INTELLIGENT LOCK

CROSS REFERENCE OF RELATED APPLICATION

This is a U.S. National Stage under 35 U.S.C 371 of the International Application PCT/CN2018/101676, filed Aug. 22, 2018, which claims priority under 35 U.S.C. 119(a-d) to CN 201710722566.9, filed Aug. 22, 2017.

BACKGROUND OF THE PRESENT INVENTION

Field of Invention

The present invention relates to an adaptive electric dual-controlled intelligent lock, which belongs to the field of daily hardware.

Description of Related Arts

In today's life, the letter box has become an essential item in daily life, but when the letter box is used, whether there is a letter in the letter box or not, people have to open the letter box every day to take a look, which is very time-consuming and laborious. In order to cooperate with the development of intelligent Internet of Things and big data, owners will consider upgrading the building's intelligent facilities and security standards, such as adding intelligent door locks, intelligent letter boxes and intelligent lifts.

In general, the building's letter boxes are designed with traditional independent stainless steel boxes and mechanical letter box lock cylinders. In the market, many companies that develop intelligent letter box products do not provide locks that can be applied to traditional letter boxes. To be converted into intelligent letter boxes, it is generally necessary to replace the entire or even the entire group of letter boxes, involving a large amount of wiring and installation of control hardware, which involves higher costs, longer construction procedures, and the generation of large amounts of waste. In addition, today's intelligent letter box systems generally do not provide the key unlocking, so there is no need to match the needs of individual age groups in the process of optimizing intelligence, such as the elderly or the users that do not temporarily use the intelligent system.

SUMMARY OF THE PRESENT INVENTION

Aiming at deficiencies, the present invention discloses an adaptive electric dual-controlled intelligent lock, which is installed in a simple way on the mechanical letter lock cylinder that is often used in the market. With the rapid development of the Internet, mobile intelligent terminals have become a necessity in life, and the intelligent access control system has developed rapidly. Many electronically controlled door locks and fingerprint locks are able to be used with mobile intelligent terminals. While human inertia is not replaced by full intelligence, when developing new intelligent products, it is firstly consider that whether the product meets the needs of different age groups, such as the elderly or users who have not yet used mobile intelligent terminals. Therefore, in addition to being compatible with the existing traditional key unlocking method, this design is able to be optimized during use, and be manipulated with a more convenient mobile intelligent terminal without contradiction in use.

To achieve the above object, the present invention adopts a technical solution as follows.

An adaptive electric dual-controlled intelligent lock, which comprises a mechanical clutching structure and an intelligent electronic control structure, wherein:

the mechanical clutching structure comprises a lock head, a lock cylinder and a lock tongue, wherein: the lock cylinder comprises two movable buckles, two springs and a bearing, wherein one end of each of the springs is fixed on the bearing, the other end of each of the springs is fixed on each of the movable buckles; a keyhole of the lock head is opposite to a locked groove defined by the movable buckles, the lock tongue is in detachable connection with the bearing, so that after being inserted into the keyhole of the lock head and then into the locked groove, a key is turned, the movable buckles respectively move in an elastic range of the springs and drive the lock tongue connected with the bearing to swing, thereby realizing a mechanical unlocking process;

the intelligent electronic control structure comprises a PCB (printed circuit board), a motor and a shifting lever, wherein: the PCB is electrically connected with the motor, one end of the shifting lever is fixed on a rotatable shaft of the motor, the other end of the shifting lever contacts with the movable buckles, the PCB comprises a wireless control module which is connected with an external mobile intelligent device for wireless connection so as to drive the motor to start; after the motor is started, the shifting lever pushes the movable buckles, so that the bearing drives the lock tongue to swing, thereby achieving an intelligent unlocking process.

Preferably, the bearing comprises a receiving plate and a connection trough body, wherein four protrusions respectively engaged with the two movable buckles are located on the receiving plate, the connection trough body comprises a sliding guide with tooth angles, a tooth angle belt fitted with the sliding guide is located at one end portion of the lock tongue, the tooth angle belt is inserted into the sliding guide so that a detachably fixed connection between the lock tongue and the connection trough body is achieved.

Preferably, there are two movable buckles which are symmetrically arranged to each other, every movable buckle has slots fitted with two protrusions on the receiving plate and a groove for accommodating each of the springs; one end of each of the springs is fixed on the receiving plate, the other end of each of the springs is against a side wall of the groove.

Preferably, a movable slot is formed by the combined two movable buckles together; the shifting lever comprises a shaft sleeve, a rotating arm and a shifting column, wherein: one end of the rotating arm is connected with the shaft sleeve, the other end of the rotating arm is connected with the shifting column, all of the shaft sleeve, the rotating arm and the shifting column are integrated into a whole, the shifting column is inserted into the movable slot; after the motor is started, the rotating arm drives the shifting column to push away the movable buckles, the receiving plate drives the lock tongue on the connection trough body to swing under an action of the springs.

Preferably, the mechanical clutching structure further comprises a first stud, a second stud and a bolt, wherein: the first stud comprises a recess portion and a rod portion, wherein the rod portion is inserted into the locked groove defined by the movable buckles, one side of the recess portion is against the lock head, the other side of the recess portion is against the movable buckles, the second stud is accommodated by the recess portion, the bolt is fixed within the second stud.

Preferably, an external surface of the recess portion of the first stud is a smooth curved surface, multiple concave-convex strips are located at an internal surface of the recess portion of the first stud, multiple concave-convex strips fitted with the internal surface of the recess portion are located at an external surface of the second stud, an internal surface of the second stud has a fixed slot fitted with a bottom of the lock head, a head portion of the bolt contacts with the movable buckles, a rod portion of the bolt contacts with the lock head, a middle portion of the bolt has a guide hole for introducing a key into the locked groove.

Preferably, the intelligent electronic control structure further comprises a cover plate and a bottom plate, wherein a chamber is defined by enclosing the cover plate and the bottom plate for accommodating the PCB and the motor, a fixed ear seat and a support ear seat are located at a side wall of the bottom plate, the recess portion of the first stud is fixed within a through-hole of the fixed ear seat, the rod portion of the first stud passes through a through-hole of the support ear seat and is fixed by a gasket, the movable buckles and the bearing are fixed between the recess portion of the first stud and the support ear seat, the shifting lever extends from a position between the fixed ear seat and the support ear seat and is in contact with the movable buckles.

Preferably, the intelligent electronic control structure further comprises a battery, wherein the cover plate has a battery slot, the battery is snapped within the battery slot and is electrically connected with the PCB, a battery cover is located above the bottom plate for replacing the battery and is in detachable connection with the bottom plate.

Preferably, the intelligent electronic control structure further comprises an LED (light emitting diode) lamp holder for monitoring letter box status and an infrared distance sensor for continuously detecting whether there is a letter in the letter box, wherein: the LED lamp holder and the infrared distance sensor are electrically connected with the PCB, and lamp beads of the LED lamp holder and the infrared distance sensor are displayed on a surface of the bottom plate.

Preferably, the PCB comprises a wireless control module which is communicated with the external mobile intelligent terminal for wireless connection and an information sending module for sending a letter prompt message to the external mobile intelligent terminal, wherein the wireless control module is a Bluetooth connection module or LAN connection module.

Compared with the prior art, the adaptive electric dual-controlled intelligent lock provided by the present invention is able to be unlocked in two ways at the same time, and realize the connection with the traditional lock cylinder and mechanical clutching switch. In the present invention, the originally fixed connection manner between the lock tongue and the lock cylinder is changed, and is replaced by detachably fixing the lock tongue to the lock cylinder; the intelligent electronic control structure is able to be directly mounted on the mechanical clutching structure, and then the lock tongue is fixed. Without changing a letter box, a lock and a key, the original traditional independent letter box is turned into an intelligent letter box; through a simple and single back-and-forth mechanical clutching design, and with the easiest installation procedure, the traditional letter box is updated to an intelligent letter box without replacing the letter box and without wiring. At the same time, after the intelligent letter box is installed, in addition that the intelligent letter box is unlocked by the original key, the intelligent letter box is also able to be controlled and performed data collection by a mobile intelligent terminal, so that the data are uploaded to a cloud Internet database through the mobile intelligent terminal or an intelligent integrated terminal.

Element symbols are described as follows:
11: locking head; 12: lock cylinder; 13: lock tongue; 14: first stud; 15: second stud; 16: bolt; 121: movable buckle; 122: spring; 123: bearing; 141: recess portion; 142: rod portion; 1211: slot; 1212: movable slot; 1231: receiving plate; 1232: connection trough body; 1233: protrusion; 12321: sliding guide; 21: PCB (printed circuit board); 22: motor; 23: shifting lever; 24: cover plate; 25: bottom plate; 26: battery; 27: battery cover; 28: LED (light emitting diode) lamp holder; 29: infrared distance sensor; 231: shaft sleeve; 232: rotating arm; 233: shifting column; 251: fixed ear seat; 252: support ear seat; 111: keyhole; 124: locked groove; 123211: tooth angle belt; 151: fixed slot; 253: battery slot; 281: lamp bead.

DETAILED DESCRIPTION OF THE PREFERRED EMBODIMENT

To more clearly describe the present invention, the present invention is further explained with accompanying drawings as follows.

Figure 1:
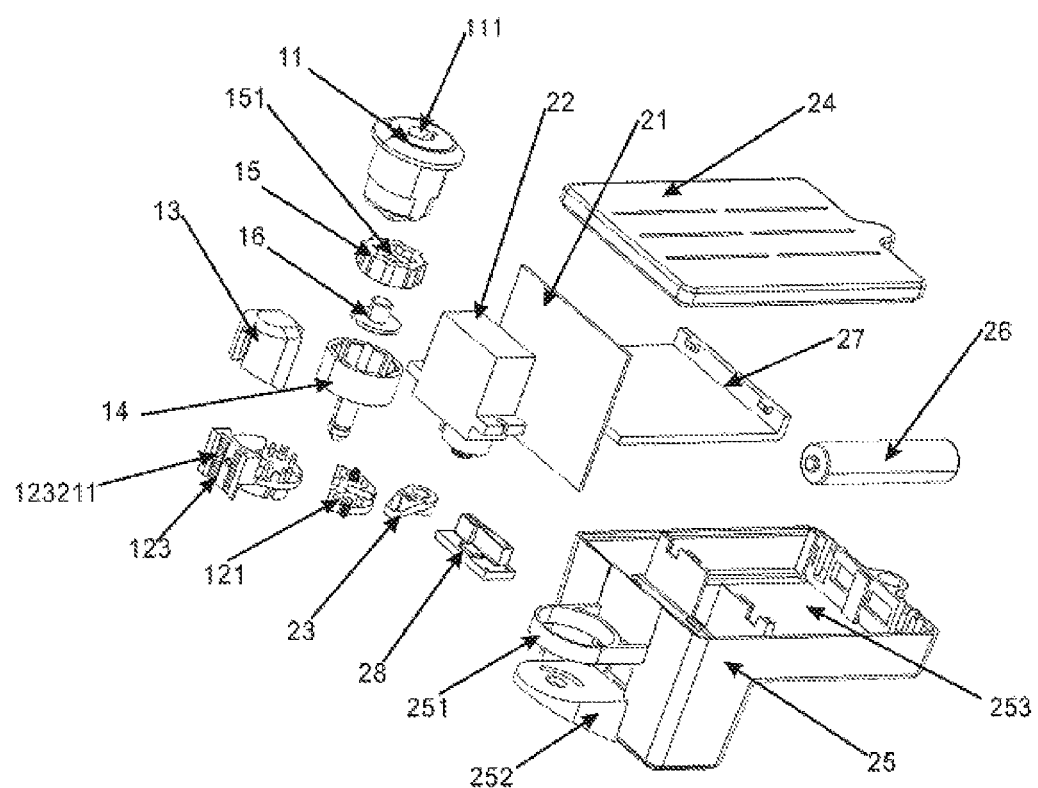
FIG. 1 is an explosive view of an adaptive electric dual-controlled intelligent lock provided by the present invention.
Figure 2:
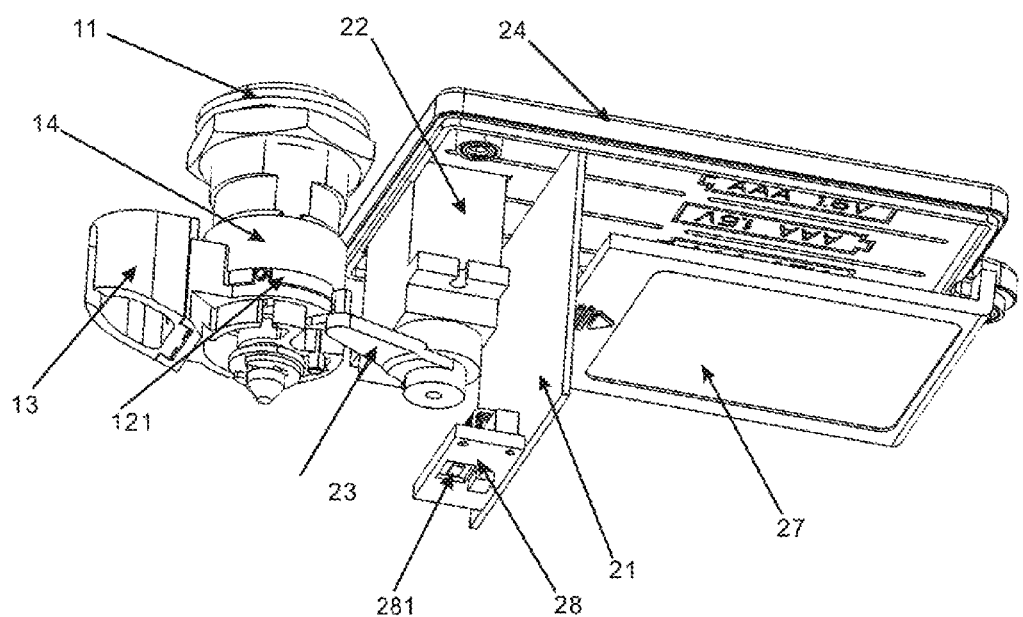
FIG. 2 is a structurally schematic view of the adaptive electric dual-controlled intelligent lock without a bottom cover provided by the present invention.
Figure 3:
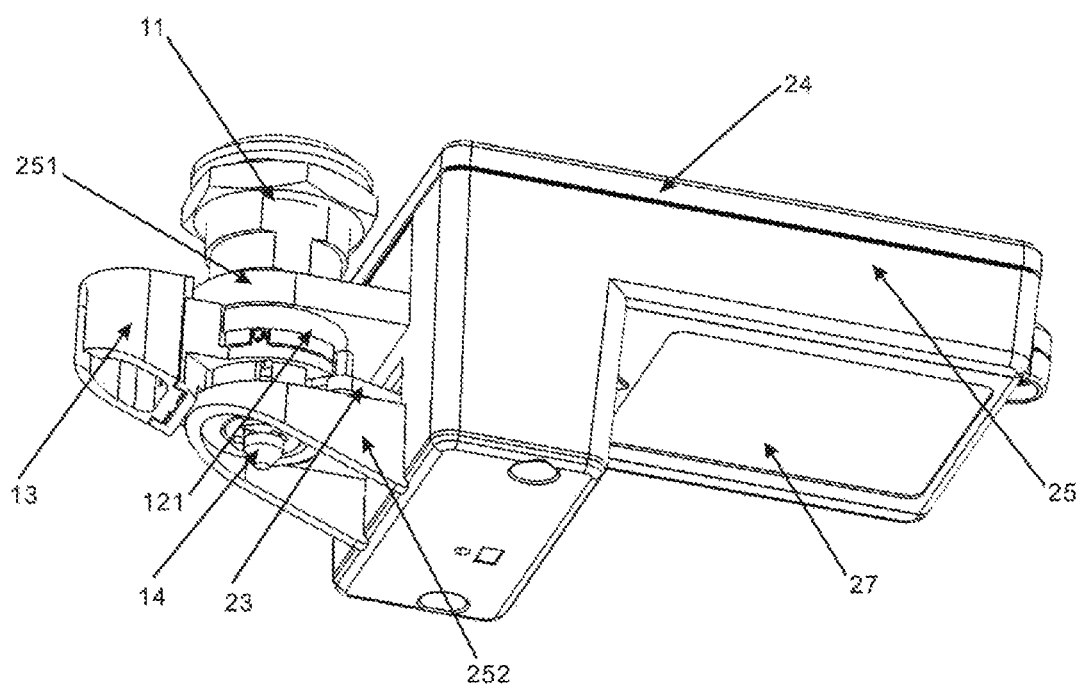
FIG. 3 is a structurally schematic view of the adaptive electric dual-controlled intelligent lock provided by the present invention.

Referring to FIGS. 1 to 3, an adaptive electric dual-controlled intelligent lock according to a preferred embodiment of the present invention is illustrated, which comprises a mechanical clutching structure and an intelligent electronic control structure. The mechanical clutching structure comprises a lock head 11, a lock cylinder 12 and a lock tongue 13, wherein: the lock cylinder 12 comprises two movable buckles 121, two springs 122 and a bearing 123, wherein one end of each of the springs 122 is fixed on the bearing 123, the other end of each of the springs 122 is fixed on each of the movable buckles 121; a keyhole 111 of the lock head 11 is opposite to a locked groove 124 defined by the movable buckles 121, the lock tongue 13 is in detachable connection with the bearing 123, so that after being inserted into the keyhole 111 of the lock head 11 and then into the locked groove 124, a key is turned, the movable buckles 121 respectively move in an elastic range of the springs 122 and drive the lock tongue 13 connected with the bearing 123 to swing, thereby realizing a mechanical unlocking process.

The intelligent electronic control structure comprises a PCB (printed circuit board) 21, a motor 22 and a shifting lever 23, wherein: the PCB 21 is electrically connected with the motor 22, one end of the shifting lever 23 is fixed on a rotatable shaft of the motor 22, the other end of the shifting lever 23 contacts with the movable buckles 121, the PCB 21 comprises a wireless control module which is connected with an external mobile intelligent device for wireless connection so as to drive the motor 22 to start; after the motor 22 is started, the shifting lever 23 pushes the movable buckles 121, so that the bearing 123 drives the lock tongue 13 to swing, thereby achieving an intelligent unlocking process.

Compared with the prior art, the adaptive electric dual-controlled intelligent lock provided by the present invention is able to be unlocked in two ways at the same time, and realize the connection with the traditional lock cylinder and mechanical clutching switch. In the present invention, the originally fixed connection manner between the lock tongue 13 and the lock cylinder 12 is changed, and is replaced by detachably fixing the lock tongue 13 to the lock cylinder 12; the intelligent electronic control structure is able to be directly mounted on the mechanical clutching structure, and then the lock tongue 13 is fixed. Without changing a letter box, a lock and a key, the original traditional independent letter box is turned into an intelligent letter box; through a simple and single back-and-forth mechanical clutching design, and with the easiest installation procedure, the traditional letter box is updated to an intelligent letter box without replacing the letter box and without wiring. At the same time, after the intelligent letter box is installed, in addition that the intelligent letter box is unlocked by the original key, the intelligent letter box is also able to be controlled and performed data collection by a mobile intelligent terminal, so that the data are uploaded to a cloud Internet database through the mobile intelligent terminal or an intelligent integrated terminal.

Figure 4:
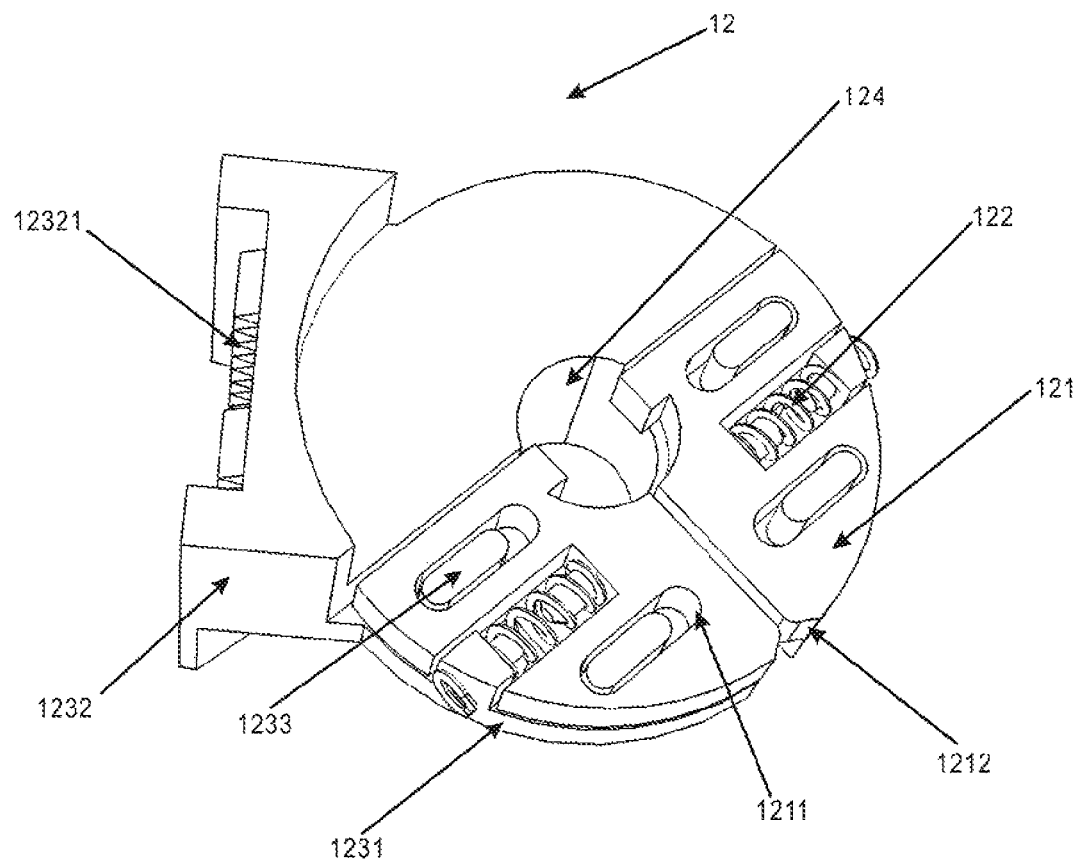
FIG. 4 is a partially schematic view of a lock cylinder of the adaptive electric dual-controlled intelligent lock provided by the present invention.

Referring to FIG. 4, the bearing 123 comprises a receiving plate 1231 and a connection trough body 1232, wherein four protrusions 1233 respectively engaged with the two movable buckles are located on the receiving plate 1231, the connection trough body 1232 comprises a sliding guide 12321 with tooth angles, a tooth angle belt 123211 fitted with the sliding guide 12321 is located at one end portion of the lock tongue 13, the tooth angle belt is inserted into the sliding guide so that a detachably fixed connection between the lock tongue 13 and the connection trough body 1232 is achieved.

According to the preferred embodiment of the present invention, there are two movable buckles which are symmetrically arranged to each other, wherein: every movable buckle has two slots 1211 fitted with two protrusions 1233 on the receiving plate 1231, and a groove for accommodating each of the springs 122; one end of each of the springs 122 is fixed on the receiving plate 1231, the other end of each of the springs 122 is against a side wall of the groove; a movable slot 1212 is formed by the combined two movable buckles together.

Figure 5:
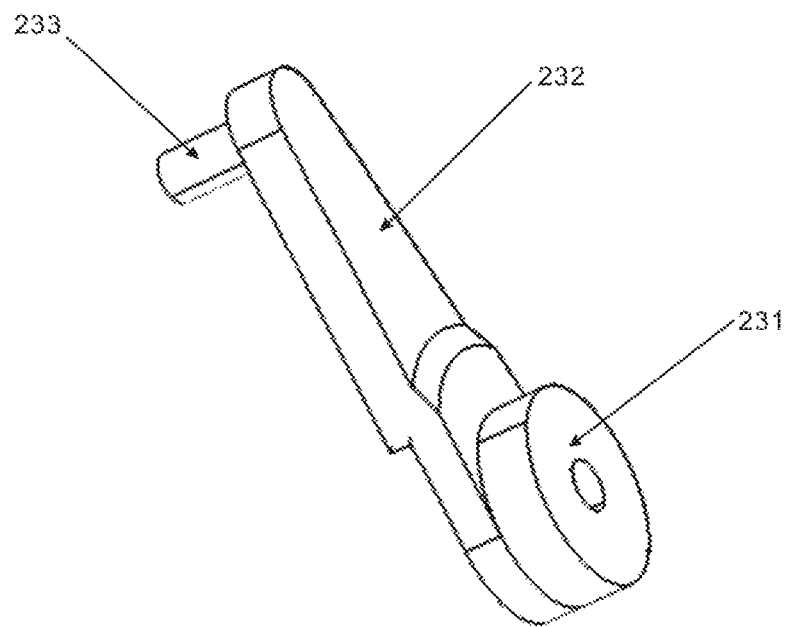
FIG. 5 is a partially explosive view of a shifting lever of the adaptive electric dual-controlled intelligent lock provided by the present invention.
Figure 6:
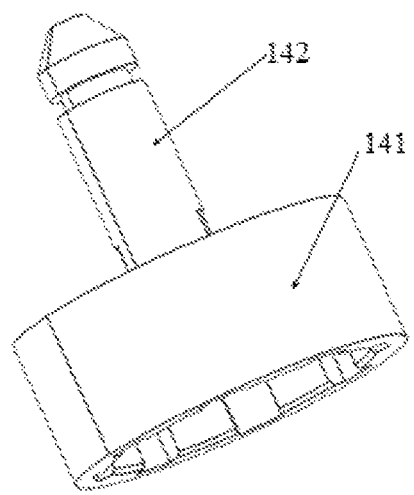
FIG. 6 is a structurally schematic view of a first stud of the adaptive electric dual-controlled intelligent lock provided by the present invention.
Figure 7:
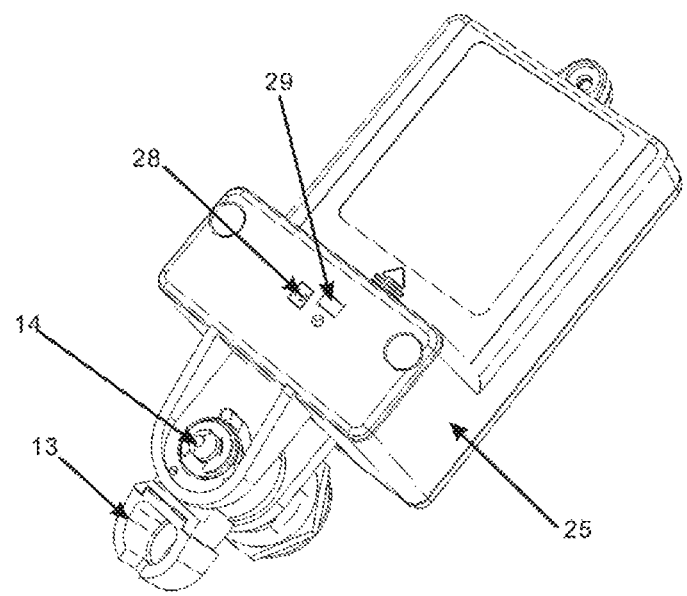
FIG. 7 is a bottom structurally schematic view of the adaptive electric dual-controlled intelligent lock provided by the present invention.

Referring to FIG. 5, the shifting lever 23 comprises a shaft sleeve 231, a rotating arm 232 and a shifting column 233, wherein: one end of the rotating arm 232 is connected with the shaft sleeve 231, the other end of the rotating arm 232 is connected with the shifting column 233, all of the shaft sleeve 231, the rotating arm 232 and the shifting column 233 are integrated into a whole, the shifting column 233 is inserted into the movable slot 1212; after the motor 22 is started, the rotating arm 232 drives the shifting column 233 to push away the movable buckles, the receiving plate 1231 drives the lock tongue 13 on the connection trough body 1232 to swing under an action of the springs 122.

The mechanical clutching structure further comprises a first stud 14, a second stud 15 and a bolt 16, wherein: the first stud 14 comprises a recess portion 141 and a rod portion 142, wherein the rod portion 142 is inserted into the locked groove defined by the movable buckles 121, one side of the recess portion 141 is against the lock head 11, the other side of the recess portion 141 is against the movable buckles, the second stud 15 is accommodated by the recess portion 141, the bolt 16 is fixed within the second stud 15, an external surface of the recess portion 141 of the first stud 14 is a smooth curved surface, multiple concave-convex strips are located at an internal surface of the recess portion 141 of the first stud 14, multiple concave-convex strips fitted with the internal surface of the recess portion 141 are located at an external surface of the second stud 15, an internal surface of the second stud 15 has a fixed slot 151 fitted with a bottom of the lock head 11, a head portion of the bolt 16 contacts with the movable buckles, a rod portion of the bolt 16 contacts with the lock head 11, a middle portion of the bolt 16 has a guide hole for introducing a key into the locked groove.

According to the preferred embodiment of the present invention, the intelligent electronic control structure further comprises a cover plate 24 and a bottom plate 25, wherein a chamber is defined by enclosing the cover plate 24 and the bottom plate 25 for accommodating the PCB 21 and the motor 22, a fixed ear seat 251 and a support ear seat 252 are located at a side wall of the bottom plate 25, the recess portion 141 of the first stud 14 is fixed within a through-hole of the fixed ear seat 251, the rod portion 142 of the first stud 14 passes through a through-hole of the support ear seat 252 and is fixed by a gasket, the movable buckles and the bearing 123 are fixed between the recess portion 141 of the first stud 14 and the support ear seat 252, the shifting lever 23 extends from a position between the fixed ear seat 251 and the support ear seat 252 and is in contact with the movable buckles.

In the process of installing the intelligent electronic control structure, the first stud 14, the second stud 15 and the bolt 16 achieve the fixation of the mechanical clutching structure together; the mechanical clutching structure without the lock tongue 13 directly passes through the fixed ear seat 251, the rod portion 142 of the first stud 14 is fixed within the through-hole of the support ear seat 252, double-sided adhesive is provided on both the fixed ear seat 251 and the support ear seat 252, so that the mechanical clutching structure is stably connected, and finally the lock tongue 13 is stably fixed to the lock cylinder 12 through the tooth angle belt, thereby achieving an effective combination between the mechanical clutching structure and the intelligent electronic control structure.

The present invention is installed in a simple way on the mechanical letter lock cylinder 12 that is often used in the market. With the rapid development of the Internet, mobile intelligent terminals have become a necessity in life, and the intelligent access control system has developed rapidly. Many electronically controlled door locks and fingerprint locks are able to be used with mobile intelligent terminals. While human inertia is not replaced by full intelligence, when developing new intelligent products, it is firstly consider that whether the product meets the needs of different age groups, such as the elderly or users who have not yet used mobile intelligent terminals. Therefore, in addition to being compatible with the existing traditional key unlocking method, this design is able to be optimized during use, and be manipulated with a more convenient mobile intelligent terminal without contradiction in use.

According to the preferred embodiment of the present invention, the intelligent electronic control structure further comprises a battery 26, wherein the cover plate 24 has a battery slot 253, the battery 26 is snapped within the battery slot and is electrically connected with the PCB 21, a battery cover 27 is located above the bottom plate 25 for replacing the battery 26 and is in detachable connection with the bottom plate 25.

According to the preferred embodiment of the present invention, the intelligent electronic control structure further comprises an LED (light emitting diode) lamp holder 28 for monitoring letter box status and an infrared distance sensor 29 for continuously detecting whether there is a letter in the letter box, wherein: the LED lamp holder 28 and the infrared distance sensor 29 are electrically connected with the PCB 21, and lamp beads 281 of the LED lamp holder 28 and the infrared distance sensor 29 are displayed on a surface of the bottom plate 25.

According to the preferred embodiment of the present invention, the PCB 21 comprises a wireless control module which is communicated with the external mobile intelligent terminal for wireless connection and an information sending module for sending a letter prompt message to the external mobile intelligent terminal, wherein the wireless control module is a Bluetooth connection module or LAN connection module.

When the letter box is opened, the intelligent lock will judge whether the door of the letter box has been closed according to the change of luminosity. When the luminosity in the letter box returns to the original luminosity, the intelligent lock of the letter box will be automatically locked. In addition, the infrared distance sensor 29 of the intelligent lock constantly detects whether there is a letter is put into the letter box and prompts the user in three different ways. The first way is to use the long bright LED indicator light on the intelligent lock; the second way is to detect for short distance and push notification information to the user's mobile phone when the user opens the mobile intelligent terminal application; the third way is to directly send the letter notification information to the application of the mobile intelligent terminal through the cloud via the intelligent integrated terminal.

The above disclosure is only a few specific embodiments of the present invention, but the present invention is not limited thereto, and any changes that can be made by those skilled in the art should fall within the protective scope of the present invention.

What is claimed is:

1. An adaptive electric dual-controlled intelligent lock, which comprises a mechanical clutching structure and an intelligent electronic control structure, wherein:
   the mechanical clutching structure comprises a lock head, a lock cylinder and a lock tongue, wherein: the lock cylinder comprises two movable buckles, two springs and a bearing, wherein one end of each of the springs is fixed on the bearing, the other end of each of the springs is fixed on each of the movable buckles; a keyhole of the lock head is opposite to a locked groove defined by the movable buckles, the lock tongue is in detachable connection with the bearing, so that after being inserted into the keyhole of the lock head and then into the locked groove, a key is turned, the movable buckles respectively move in an elastic range of the springs and drive the lock tongue connected with the bearing to swing, thereby realizing a mechanical unlocking process;
   the intelligent electronic control structure comprises a PCB (printed circuit board), a motor and a shifting lever, wherein: the PCB is electrically connected with the motor, one end of the shifting lever is fixed on a rotatable shaft of the motor, the other end of the shifting lever contacts with the movable buckles, the PCB comprises a wireless control module which is connected with an external mobile intelligent device for wireless connection so as to drive the motor to start; after the motor is started, the shifting lever pushes the movable buckles, so that the bearing drives the lock tongue to swing, thereby achieving an intelligent unlocking process.

2. The adaptive electric dual-controlled intelligent lock, as recited in claim 1, wherein: the bearing comprises a receiving plate and a connection trough body, wherein four protrusions respectively engaged with the two movable buckles are located on the receiving plate, the connection trough body comprises a sliding guide with tooth angles, a tooth angle belt fitted with the sliding guide is located at one end portion of the lock tongue, the tooth angle belt is inserted into the sliding guide so that a detachably fixed connection between the lock tongue and the connection trough body is achieved.

3. The adaptive electric dual-controlled intelligent lock, as recited in claim 2, wherein: there are two movable buckles which are symmetrically arranged to each other, every movable buckle has two slots fitted with two of the protrusions on the receiving plate and a groove for accommodating each of the springs; one end of each of the springs is fixed on the receiving plate, the other end of each of the springs is against a side wall of the groove.

4. The adaptive electric dual-controlled intelligent lock, as recited in claim 3, wherein: a movable slot is formed by the combined two movable buckles together; the shifting lever comprises a shaft sleeve, a rotating arm and a shifting column, wherein: one end of the rotating arm is connected with the shaft sleeve, the other end of the rotating arm is connected with the shifting column, all of the shaft sleeve, the rotating arm and the shifting column are integrated into a whole, the shifting column is inserted into the movable slot; after the motor is started, the rotating arm drives the shifting column to push away the movable buckles, the receiving plate drives the lock tongue on the connection trough body to swing under an action of the springs.

5. The adaptive electric dual-controlled intelligent lock, as recited in claim 1, wherein: the mechanical clutching structure further comprises a first stud, a second stud and a bolt, wherein: the first stud comprises a recess portion and a rod portion, wherein the rod portion is inserted into the locked groove defined by the movable buckles, one side of the recess portion is against the lock head, the other side of the recess portion is against the movable buckles, the second stud is accommodated by the recess portion, the bolt is fixed within the second stud.

6. The adaptive electric dual-controlled intelligent lock, as recited in claim 5, wherein: an external surface of the recess portion of the first stud is a smooth curved surface, multiple concave-convex strips are located at an internal surface of the recess portion of the first stud, multiple concave-convex strips fitted with the internal surface of the recess portion are located at an external surface of the second stud, an internal surface of the second stud has a fixed slot fitted with a bottom of the lock head, a head portion of the bolt contacts with the movable buckles, a rod portion of the bolt contacts with the lock head, a middle portion of the bolt has a guide hole for introducing a key into the locked groove.

7. The adaptive electric dual-controlled intelligent lock, as recited in claim 6, wherein: the intelligent electronic control structure further comprises a cover plate and a bottom plate, wherein a chamber is defined by enclosing the cover plate and the bottom plate for accommodating the PCB and the motor, a fixed ear seat and a support ear seat are located at a side wall of the bottom plate, the recess portion of the first stud is fixed within a through-hole of the fixed ear seat, the rod portion of the first stud passes through a through-hole of the support ear seat and is fixed by a gasket, the movable buckles and the bearing are fixed between the recess portion of the first stud and the support ear seat, the shifting lever extends from a position between the fixed ear seat and the support ear seat and is in contact with the movable buckles.

8. The adaptive electric dual-controlled intelligent lock, as recited in claim 7, wherein: the intelligent electronic control structure further comprises a battery, wherein the cover plate has a battery slot, the battery is snapped within the battery slot and is electrically connected with the PCB, a battery cover is located above the bottom plate for replacing the battery and is in detachable connection with the bottom plate.

9. The adaptive electric dual-controlled intelligent lock, as recited in claim 7, wherein: the intelligent electronic control structure further comprises an LED (light emitting diode) lamp holder for monitoring letter box status and an infrared distance sensor for continuously detecting whether there is a letter in the letter box, wherein: the LED lamp holder and the infrared distance sensor are electrically connected with the PCB, and lamp beads of the LED lamp holder and the infrared distance sensor are displayed on a surface of the bottom plate.

10. The adaptive electric dual-controlled intelligent lock, as recited in claim 1, wherein: the PCB comprises a wireless control module which is communicated with the external mobile intelligent device for wireless connection and an information sending module for sending a letter prompt message to the external mobile intelligent device, wherein the wireless control module is a Bluetooth connection module or LAN connection module.

\* \* \* \* \*